United States Patent
Gilgen et al.

(10) Patent No.: US 7,115,970 B2
(45) Date of Patent: Oct. 3, 2006

(54) CAPACITOR FOR USE IN AN INTEGRATED CIRCUIT

(75) Inventors: Brent Gilgen, Boise, ID (US); Belford T. Coursey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,718

(22) Filed: Sep. 1, 2004

(65) Prior Publication Data

US 2005/0090070 A1    Apr. 28, 2005

Related U.S. Application Data

(62) Division of application No. 09/945,555, filed on Aug. 30, 2001, now Pat. No. 6,888,217.

(51) Int. Cl.
  *H01L 29/00* (2006.01)
  *H01L 21/00* (2006.01)

(52) U.S. Cl. ........................... 257/534; 438/398

(58) Field of Classification Search ............... 438/396, 438/398; 257/532, 534
See application file for complete search history.

(56) References Cited

U.S. PATENT DOCUMENTS

| | | | |
|---|---|---|---|
| 5,049,517 A | 9/1991 | Liu et al. | |
| 5,059,920 A | 10/1991 | Anderson et al. | 330/253 |
| 5,082,797 A * | 1/1992 | Chan et al. | 438/255 |
| 5,142,438 A | 8/1992 | Reinberg et al. | 361/313 |
| 5,162,248 A | 11/1992 | Dennison et al. | |
| 5,185,282 A * | 2/1993 | Lee et al. | 438/253 |
| 5,238,862 A | 8/1993 | Blalock et al. | |
| 5,266,512 A | 11/1993 | Kirsch | |
| 5,281,548 A | 1/1994 | Prall | |
| 5,300,801 A | 4/1994 | Blalock et al. | 257/309 |
| 5,384,152 A * | 1/1995 | Chu et al. | 438/386 |
| 5,436,188 A | 7/1995 | Chen | |
| 5,583,359 A | 12/1996 | Ng et al. | 257/306 |
| 5,595,928 A * | 1/1997 | Lu et al. | 438/253 |
| 5,597,756 A * | 1/1997 | Fazan et al. | 438/398 |
| 5,652,170 A * | 7/1997 | Keller et al. | 438/695 |
| 5,658,381 A * | 8/1997 | Thakur et al. | 257/309 |
| 5,700,731 A * | 12/1997 | Lin et al. | 438/381 |
| 5,744,387 A * | 4/1998 | Tseng | 438/253 |

(Continued)

FOREIGN PATENT DOCUMENTS

JP    1-283860    * 11/1989

OTHER PUBLICATIONS

Peter Van Zant, Microchip Fabrication, 1997, McGraw-Hill, 3rd Edition, pp. 503-505.*

(Continued)

*Primary Examiner*—Evan Pert
(74) *Attorney, Agent, or Firm*—Schwegman, Lundberg, Woessner & Kluth, P.A.

(57) ABSTRACT

Capacitors for use in an integrated circuit are provided. One aspect of this disclosure relates to a method of making a capacitor. According to various embodiments of the method a bottom electrode adapted to act as an etch stop is formed, a substantially cone-shaped first plate of conductive material is formed having an interior and exterior surface and terminating at the bottom electrode, a layer of dielectric material is formed on at least a portion of the interior and exterior surface of the first plate and substantially conforming to the shape of the first plate, and a second plate of conductive material is formed over the layer of dielectric material. Other aspects and embodiments are provided herein.

27 Claims, 12 Drawing Sheets

U.S. PATENT DOCUMENTS

| | | | |
|---|---|---|---|
| 5,759,894 A * | 6/1998 | Tseng et al. | 438/255 |
| 5,792,680 A | 8/1998 | Sung et al. | 438/210 |
| 5,849,624 A * | 12/1998 | Fazan et al. | 438/398 |
| 5,851,898 A * | 12/1998 | Hsia et al. | 438/398 |
| 5,885,865 A * | 3/1999 | Liang et al. | 438/253 |
| 5,902,126 A * | 5/1999 | Hong et al. | 438/396 |
| 5,920,763 A | 7/1999 | Schuegraf | 438/3 |
| 5,933,725 A | 8/1999 | Kirsch et al. | 438/239 |
| 5,943,582 A * | 8/1999 | Huang et al. | 438/396 |
| 5,985,732 A | 11/1999 | Fazan et al. | 438/398 |
| 6,010,942 A * | 1/2000 | Chien et al. | 438/396 |
| 6,025,624 A | 2/2000 | Figura | 257/306 |
| 6,037,213 A * | 3/2000 | Shih et al. | 438/253 |
| 6,037,219 A * | 3/2000 | Lin et al. | 438/255 |
| 6,037,234 A * | 3/2000 | Hong et al. | 438/396 |
| 6,077,742 A * | 6/2000 | Chen et al. | 438/255 |
| 6,087,217 A * | 7/2000 | Li et al. | 438/255 |
| 6,100,136 A * | 8/2000 | Lin et al. | 438/253 |
| 6,100,137 A * | 8/2000 | Chen et al. | 438/253 |
| 6,103,568 A * | 8/2000 | Fujiwara | 438/253 |
| 6,130,835 A | 10/2000 | Scheuerlein | 365/171 |
| 6,133,600 A | 10/2000 | Sandhu | 257/308 |
| 6,159,793 A * | 12/2000 | Lou | 438/255 |
| 6,166,941 A | 12/2000 | Yoshida et al. | 365/63 |
| 6,174,769 B1 * | 1/2001 | Lou | 438/253 |
| 6,174,782 B1 * | 1/2001 | Lee | 438/396 |
| 6,174,817 B1 * | 1/2001 | Doshi et al. | 438/706 |
| 6,177,309 B1 * | 1/2001 | Lee | 438/253 |
| 6,177,320 B1 * | 1/2001 | Cho et al. | 438/279 |
| 6,180,452 B1 | 1/2001 | Figura | 438/255 |
| 6,187,624 B1 * | 2/2001 | Huang | 438/253 |
| 6,190,960 B1 | 2/2001 | Noble | 438/253 |
| 6,194,229 B1 | 2/2001 | Basceri | 438/3 |
| 6,194,262 B1 | 2/2001 | Noble | 438/253 |
| 6,194,265 B1 * | 2/2001 | Chang et al. | 438/255 |
| 6,214,688 B1 * | 4/2001 | Hwang et al. | 438/396 |
| 6,215,187 B1 | 4/2001 | Ooto et al. | 257/758 |
| 6,218,239 B1 * | 4/2001 | Huang et al. | 438/253 |
| 6,258,662 B1 * | 7/2001 | Wang et al. | 438/253 |
| 6,261,900 B1 * | 7/2001 | Liao et al. | 438/253 |
| 6,274,428 B1 * | 8/2001 | Wu | 438/255 |
| 6,294,420 B1 * | 9/2001 | Tsu et al. | 438/239 |
| 6,319,789 B1 | 11/2001 | Carstensen | 438/396 |
| 6,329,683 B1 * | 12/2001 | Kohyama | 257/306 |
| RE37,505 E | 1/2002 | Blalock et al. | 257/309 |
| 6,352,866 B1 | 3/2002 | Basceri | 438/3 |
| 6,362,043 B1 | 3/2002 | Noble | 438/253 |
| 6,368,913 B1 * | 4/2002 | Yamamoto | 438/255 |
| 6,372,572 B1 * | 4/2002 | Yu et al. | 438/241 |
| 6,373,084 B1 | 4/2002 | Figura | 257/296 |
| 6,385,020 B1 * | 5/2002 | Shin et al. | 361/15 |
| 6,403,444 B1 * | 6/2002 | Fukuzumi et al. | 438/396 |
| 6,410,955 B1 | 6/2002 | Baker et al. | 257/307 |
| 6,417,065 B1 * | 7/2002 | Wu et al. | 438/396 |
| 6,444,538 B1 * | 9/2002 | Kwon et al. | 438/396 |
| 6,448,146 B1 * | 9/2002 | Lee et al. | 438/398 |
| 6,458,653 B1 * | 10/2002 | Jang | 438/253 |
| 6,483,194 B1 * | 11/2002 | Sakao | 257/760 |
| 6,537,874 B1 * | 3/2003 | Nakamura et al. | 438/253 |
| 6,576,946 B1 | 6/2003 | Kanai et al. | 257/306 |
| 6,838,719 B1 * | 1/2005 | Hwang et al. | 257/296 |
| 2001/0008784 A1 | 7/2001 | Noble | 438/239 |

OTHER PUBLICATIONS

Burns and Bond, "Principles of Electronics Circuits", *West Publishing Company*, 1st Edition,(1987),390-396.

Gray & Meyer, "Analysis and Design of Analog Integrated Circuits", *John Wiley & sons, Inc.*, 3rd Edition,(1993),168-170.

Watanabe, et al., "An Advanced Technique for Fabricating Hemispherical-Grained (HSG) Silicon Storage Electrodes", *IEEE Transactions on Electron Devices*, vol. 42,No. 2, (Feb. 1995),295-300.

Yamamoto, I , "Low-Temperature Metal/ON/HSG-Cylinder Capacitor Process for High Density Embedded DRAMs,", *Symposium on VLSI Technology Digest of Technical Papers*, (1999), 157-158.

* cited by examiner

CAPACITOR FOR USE IN AN INTEGRATED CIRCUIT

CROSS-REFERENCE TO RELATED APPLICATIONS

This application is a Divisional of U.S. application Ser. No. 09/945,555, filed Aug. 30, 2001, now issued as U.S. Pat. No. 6,888,217, which is incorporated herein by reference.

The present application is related to U.S. patent application Ser. No. 09/838,526, filed Apr., 19, 2001, now U.S. Pat. No. 6,410,955 and assigned to the same assignee as the present invention.

FIELD OF THE INVENTION

The present invention relates generally to semiconductor integrated circuits, and more particularly to a capacitor and capacitor array for use in integrated circuits, such as memory systems and the like.

BACKGROUND OF THE INVENTION

There is a continuing demand for electronic systems to perform more functions or operations in shorter periods of time. This typically requires additional components to perform the additional functions and to store more programs and data. At the same time packaging requirements are decreasing in size. Consumers want smaller, lighter weight products that do more and are more mobile or portable. Accordingly, circuit designers are challenged to provide more components and greater capacity per unit of area on a semiconductor die.

Most electronic circuits include basic electrical components such as transistors, resistors, inductors, capacitors and the like. Capacitors are one component that can occupy considerable area on a semiconductor die depending upon the size of the capacitor or the number of capacitors. For example, a memory system or device can include a large number of capacitors for storing information. Capacitors are typically made by depositing a first metal plate, depositing a layer of dielectric material over the first metal plate and then depositing a second metal plate over the layer of dielectric material and substantially parallel to the first metal plate. The size of the capacitance will be a function of the surface area of the two facing parallel plates and other parameters such as the dielectric constant of the dielectric material and the spacing between the plates. Accordingly, one primary means of increasing the capacitance, is to increase the size of each of the parallel plates but this will also consume more area on the semiconductor die.

As previously mentioned, some electronic circuits, such as memory devices or systems use capacitors to store data electronically. For example, a capacitor with a charge on it can represent a logic 1 and an uncharged capacitor can represent a logic 0. Accordingly, as electronic systems or computer systems are required to perform more functions and to store more programs and data, memory devices and systems will require more memory cells with each cell including a capacitor to store the information. Memory device and system designers are therefore challenged to provide more storage capacity while using a minimum amount of area on a semiconductor die. For efficiency and speed of operation, the stored information is also preferably located close to those components that access and use the information. Accordingly, memory devices or systems are often formed on the same chip or semiconductor die with other components and it becomes important in the manufacturing process that the operations to make the different components are compatible and do not adversely effect one another and that the different components can be manufactured efficiently with the lowest possible cost and time.

Accordingly, for the reason stated above, and for other reasons that will become apparent upon reading and understanding the present specification, there is a need for a capacitor or an array of capacitors that maximizes the amount of capacitance and number of capacitors per unit of area of a semiconductor die or chip. There is also a need for a capacitor or capacitor array that can be manufactured efficiently with minimal process operations and with process operations that are compatible with or do not interfere with other circuitry or components formed on the same semiconductor die.

SUMMARY OF THE INVENTION

In accordance with the present invention, a capacitor includes a first plate of conductive material formed in a predetermined shape. A layer of dielectric material is formed on at least a portion of the first plate and substantially conforms to the predetermined shape of the first plate. A second plate is formed over the layer of dielectric material.

In accordance with an embodiment of the present invention, a capacitor includes a layer of forming material and a nucleation layer formed on the layer of forming material. A substantially cone-shaped first plate of conductive material includes a vertex portion extending through the nucleation layer and partially into the layer of forming material. At least one of an interior surface and an exposed exterior surface of the first plate extending from the layer of forming material and the nucleation layer can be converted to hemispherical grains. A layer of dielectric material is formed on the nucleation layer and on the interior surface and the exposed exterior surface of the first plate. The dielectric layer substantially conforms to the shape of the first plate and the hemispherical grains. A second plate of conductive material is formed over the dielectric layer.

In accordance with an embodiment of the present invention, an array of capacitors includes a plurality of first plates of conductive material. Each first plate is formed in a predetermined shape with an open or hollow interior portion. A layer of dielectric material is formed on the plurality of first plates and substantially conforms to the shape of each of the first plates. A second plate of conductive material is formed over the layer of dielectric material.

In accordance with an embodiment of the present invention, a memory system includes an array of memory elements and each memory element includes a capacitor. Each capacitor comprises a first plate of conductive material formed in a predetermined shape. A layer of dielectric material is formed on at least a portion of the first plate and substantially conforms to the shape of the first plate. A second plate of conductive material is formed over the layer of dielectric material.

In accordance with the present invention, a semiconductor die includes a substrate and an integrated circuit formed on or supported by the substrate. The integrated circuit includes at least one capacitor. The capacitor includes a first plate of conductive material formed in a predetermined shape and a layer of dielectric material formed on at least a portion of the first plate and substantially conforming to the shape of the first plate. A second plate of conductive material is formed over the layer of dielectric material.

In accordance with the present invention, an electronic system includes a processor and a memory system coupled to the processor. The memory system comprises an array of memory elements and each memory element includes a capacitor. Each capacitor includes a first plate of conductive material formed in a predetermined shape. A layer of dielectric material is formed on at least a portion of the first plate and substantially conforms to the shape of the first plate. A second plate of conductive material is formed over the layer of dielectric material.

In accordance with the present invention, a method of making a capacitor includes: forming a substantially cone-shaped first plate of conductive material; forming a layer of dielectric material on at least a portion of the first plate and substantially conforming to the shape of the first plate; and forming a second plate of conductive material over the layer of dielectric material.

In accordance with the present invention, a method of making a memory system includes: forming an array of memory elements; and forming a capacitor associated with each memory element. Forming each capacitor includes: forming a first plate of conductive material formed in a predetermined shape, forming a layer of dielectric material formed on at least a portion of the first plate and substantially conforming to the shape of the first plate, and forming a second plate of conductive material formed over the layer of dielectric material.

In accordance with the present invention, a method of making a semiconductor die includes: providing a substrate; forming an integrated circuit supported by the substrate; and forming a capacitor associated with the integrated circuit. Forming the capacitor includes: forming a first plate of conductive material formed in a predetermined shape, forming a layer of dielectric material formed on at least a portion of the first plate and substantially conforming to the shape of the first plate, and forming a second plate of conductive material formed over the layer of dielectric material.

In accordance with the present invention, a method of making an electronic system includes: forming a processor; and forming a memory system coupled to the processor. The memory system includes a plurality of memory cells and each memory cell includes a capacitor. Forming each capacitor includes: forming a first plate of conductive material formed in a predetermined shape, forming a layer of dielectric material formed on at least a portion of the first plate and substantially conforming to the shape of the first plate, and forming a second plate of conductive material formed over the layer of dielectric material.

These and other embodiments, aspects, advantages and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

In the drawings, like numerals describe substantially similar components throughout the several views. Like numerals having different letter suffixes or primed (X') represent different occurrences of substantially similar components.

DESCRIPTION OF THE EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

The transistors described herein include transistors from bipolar-junction technology (BJT), field effect technology (FET), or complimentary metal-oxide-semiconductor (CMOS). A metal-oxide-semiconductor (MOS) transistor includes a gate, a first node (drain) and a second node (source). Since a MOS transistor is typically a symmetrical device, the true designation of "source" and "drain" is only possible once voltage is impressed on the terminals. The designations of source and drain herein should be interpreted, therefore, in the broadest sense. It should also be noted that a P-channel MOS transistor could alternatively be used for an N-channel MOS transistor and vice versa with the polarity of the associated gate voltages merely being reversed. For example, applying a negative gate voltage in the situation of a P-channel MOS transistor to activate the transistor and reversing the polarity to apply a positive gate voltage to activate an N-channel transistor if an N-channel MOS transistor is substituted for a P-channel transistor.

Figure 1A:
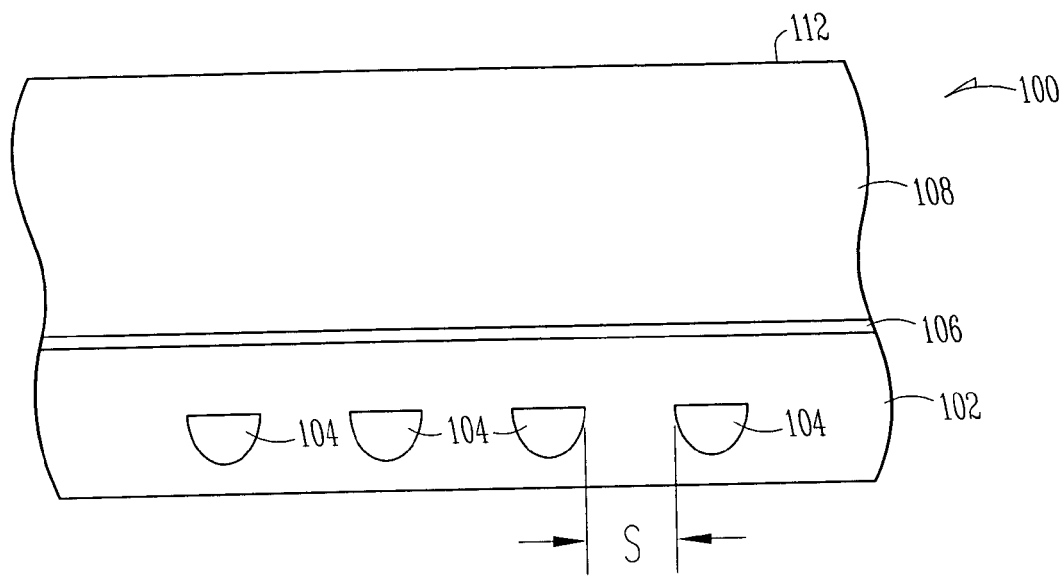
FIGS. 1A–1H illustrate the operations in forming a capacitor or an array of capacitors in accordance with the present invention.

FIGS. 1A–1H illustrate the operations in forming a capacitor or an array of capacitors 100 in accordance with the present invention. In FIG. 1A, a first layer 102 of forming material is deposited or formed. The first layer 102 of forming material can be a doped oxide or the like. A plurality of electrodes 104 can be formed in the first layer 102 of forming material by conventional photolithographic techniques. The electrodes 104 can have a selected pitch or spacing S between them. The electrodes 104 can be made of a metal or semiconductive material. A nucleation layer 106 can be formed on the first layer 102. The nucleation layer 106 can be formed from an undoped oxide or the like. A second layer 108 of forming material can be formed on the nucleation layer 106. The second layer 108 of forming material can also be a layer of doped oxide or the like. The nucleation layer 106 can be much thinner than the first layer 102 of forming material and the second layer 108 of forming material can be much thicker than the first layer 102.

Figure 1B:
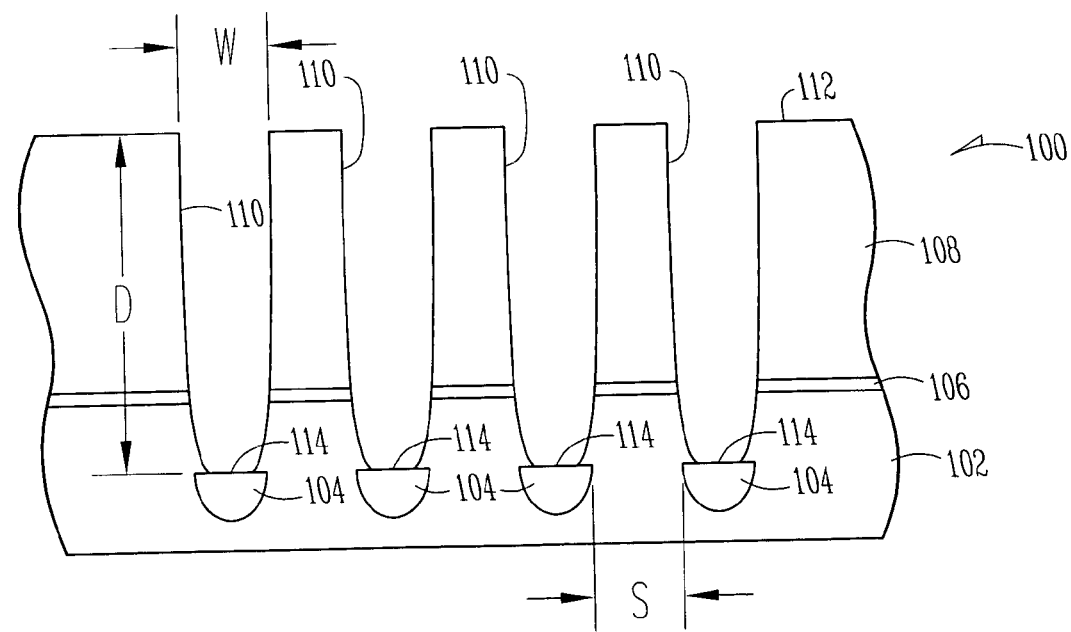

In FIG. 1B, a plurality of openings or cavities 110 are formed in a surface 112 of the second layer 108 of forming material and in alignment with each of the electrodes 104. The cavities 110 are formed down through the second layer 108, the nucleation layer 106 and partially through the first layer 102 of forming material to expose a top portion 114 of each of the electrodes 104. The electrodes 104 serve as an etch stop to define the bottom of each of the cavities 110. The cavities 110 are formed to have a predetermined shape by standard photolithographic techniques and can have a depth dimension D much larger than a diameter or width dimension W. The predetermined shape of the cavities 110 can be substantially cone-shaped and can have a substantially elliptical or circular cross-section as shown in FIG. 2.

Figure 1C:
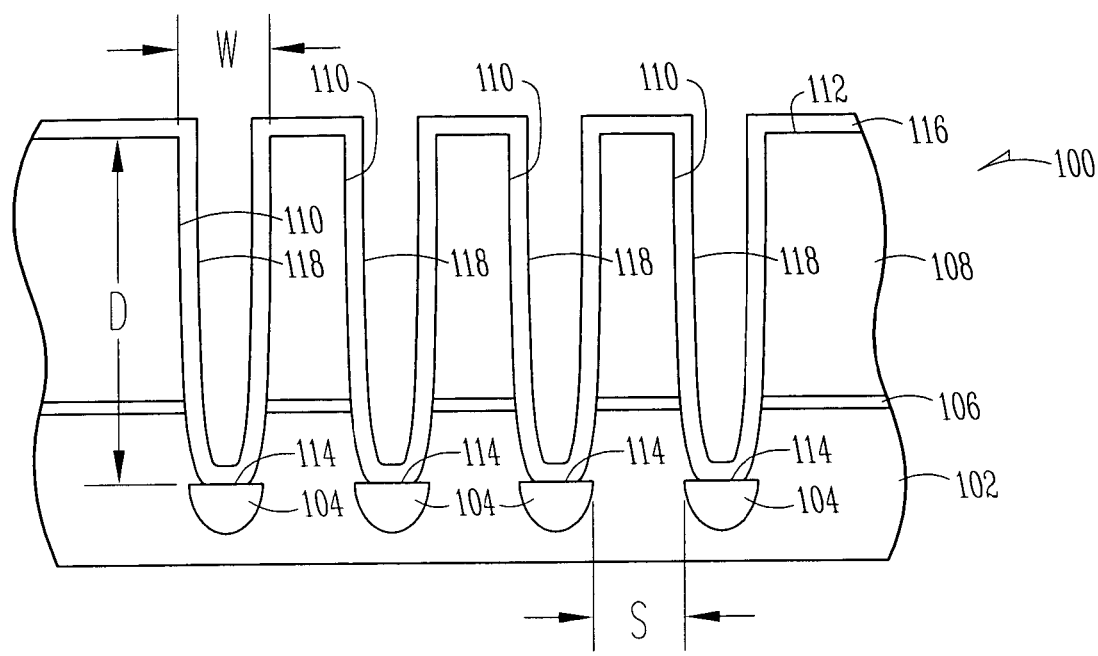

In FIG. 1C a first plate layer 116 of conductive material is deposited or formed on the surface of the second layer 112 of forming material and in each of the cavities 110. The first plate layer 116 can have a thickness of about 300 angstroms. The first plate layer 116 forms a predetermined shape corresponding to or conforming to the predetermined shape of each of the cavities 110 and the first plate layer 116 forms open or hollow interior portions or surfaces 118. The first plate layer 116 can be formed from a conductive metal, polysilicon or a semiconductor material.

Figure 1D:
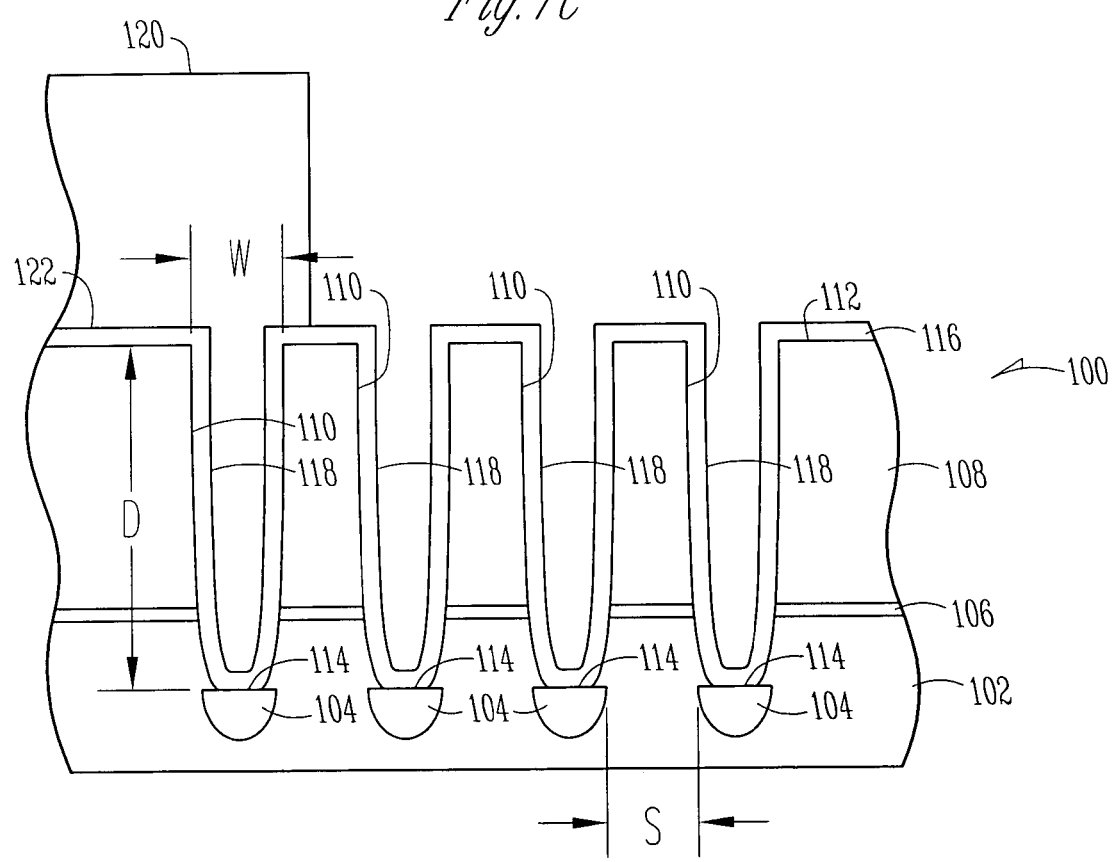
Figure 2:
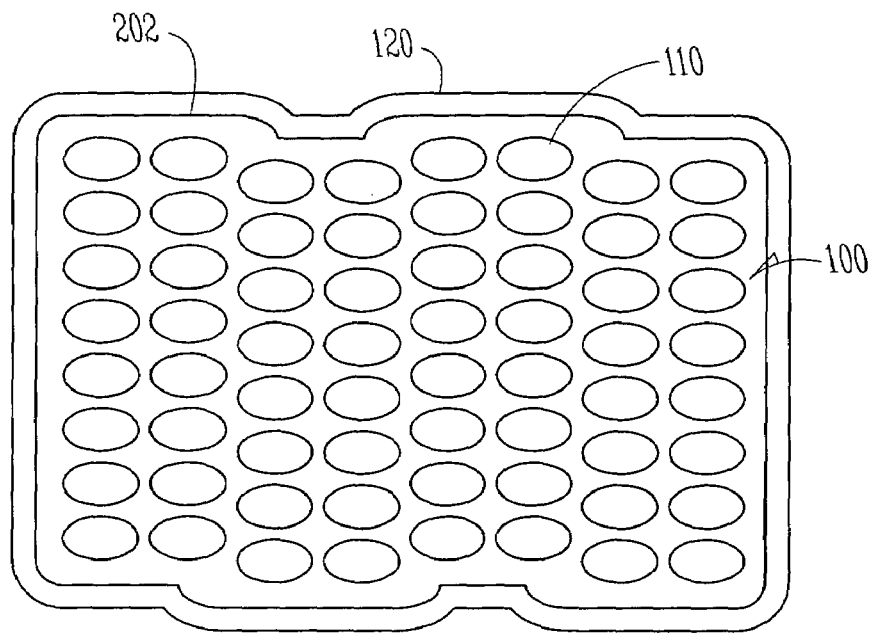
FIG. 2 is a top elevation view of a plurality of cavities formed in a substrate to form a capacitor array in accordance with the present invention.

Referring to FIG. 1D and also to FIG. 2, an isolation wall 120 can be formed around the capacitor array 100. The isolation wall 120 prevents the etchants or other materials used in the process operations to form the capacitor array 100 from adversely affecting or interfering with other components or integrated circuits already formed on the chip or die. The isolation wall 120 can be a photo mask or be covered by a photo mask to prevent or block etchants or other materials from contacting the other circuits or components on the chip. The isolation wall 120 defines the capacitor array 110 and is preferably formed over the cavities 110 proximal to a periphery 122 of the capacitor array 100.

Figure 1E:
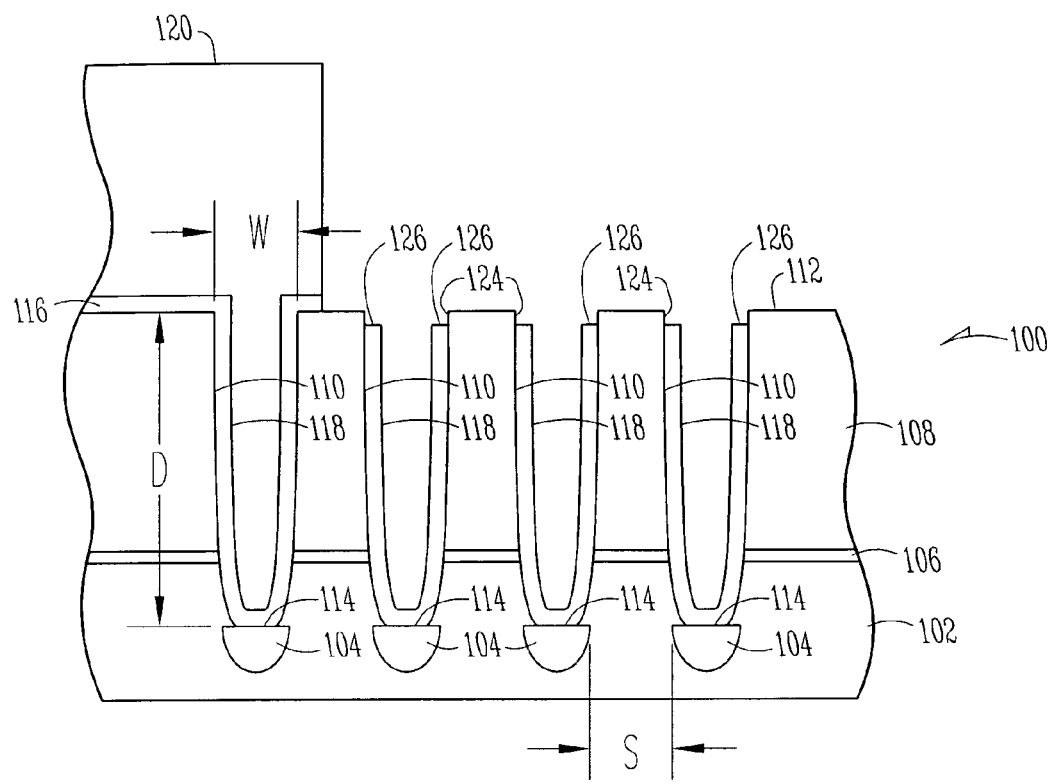

In FIG. 1E, the first plate layer 116 is selectively removed from the surface 112 of the second layer 108 of forming material between the cavities 110 to form a plurality of first plates or first capacitor plates 126. A small segment of each first plate 126 can be removed from a small portion 124 of each of the cavities 110 near the surface 112 of the second layer 108. The first plate layer 116 can be selectively removed by dry etching with an etchant that is non-reactive to the second layer 108 of forming material.

Figure 1F:
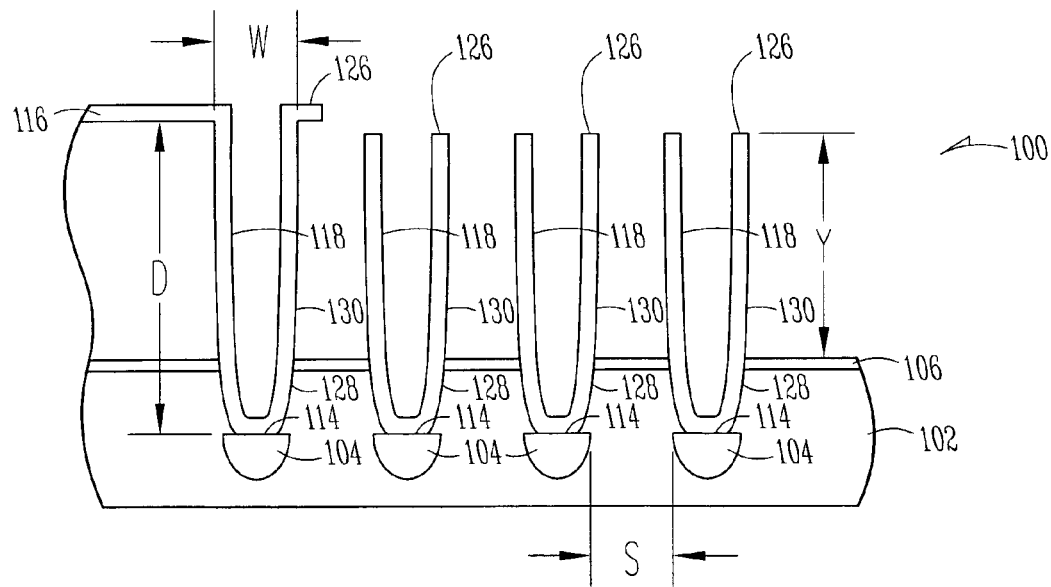

In FIG. 1F, the second layer 108 of forming material and the photo mask covering the isolation wall 120 are removed. The array 100 can be exposed to a cleaning process to remove the photo mask of the isolation wall 120. The second layer 108 can be removed by wet etching with an etchant that is non-reactive to the conductive material of the first plates 126. The first plates 126 can act as a mask in the process of removing the second layer 108 of forming material. The nucleation layer 106 can act as an etch stop or to at least slow down the etch rate so that it can be stopped at a predetermined depth Y. The first layer 102 of forming material is preserved to support the first plates 126. In an embodiment where a nucleation layer 106 is not used and there is only a single layer 102 of forming material, the etching process must be stopped so that a sufficient portion of the first layer 102 remains to support the first plates 126 during the remainder of the processing. Each of the first plates 126 have a predetermined shape that as shown in the embodiment of FIG. 1F can be substantially cone-shaped including a vertex portion 128 or closed end extending through the nucleation layer (if present) and partially into the first layer 102 of forming material. Each of the first plate members 126 have an interior surface 118 or portion, as previously discussed, and an exposed exterior or outer surface 130 extending from the first layer 102 and the nucleation layer 106.

Figure 1G:
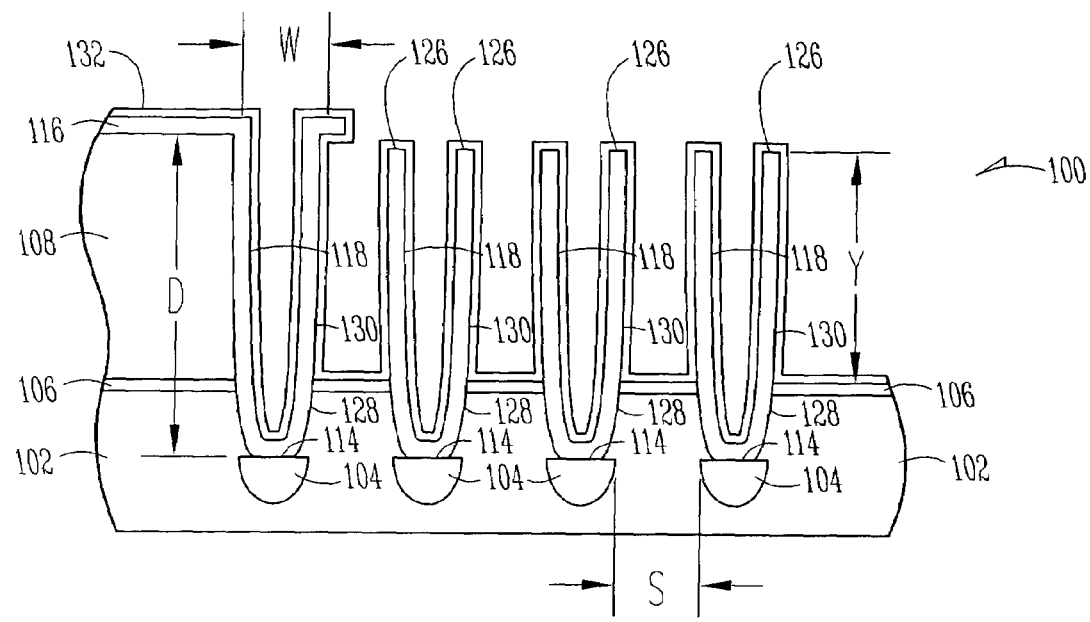

In FIG. 1G, a layer 132 of dielectric material is formed on the nucleation layer 106 and on the first plates 126. The layer 132 will substantially conform to the shape of the first plates 126 and will cover the interior surfaces 118 and exterior surfaces 130 of the first plates 126 exposed above the nucleation layer 106. The layer 132 can be a nitride, an oxide or a dielectric of any thickness. The undoped oxide of the nucleation layer 106 facilitates the nucleation or formation of the dielectric layer 132 on the nucleation layer 106 which permits the formation of a thinner layer of dielectric on the first plates 126.

Figure 1H:
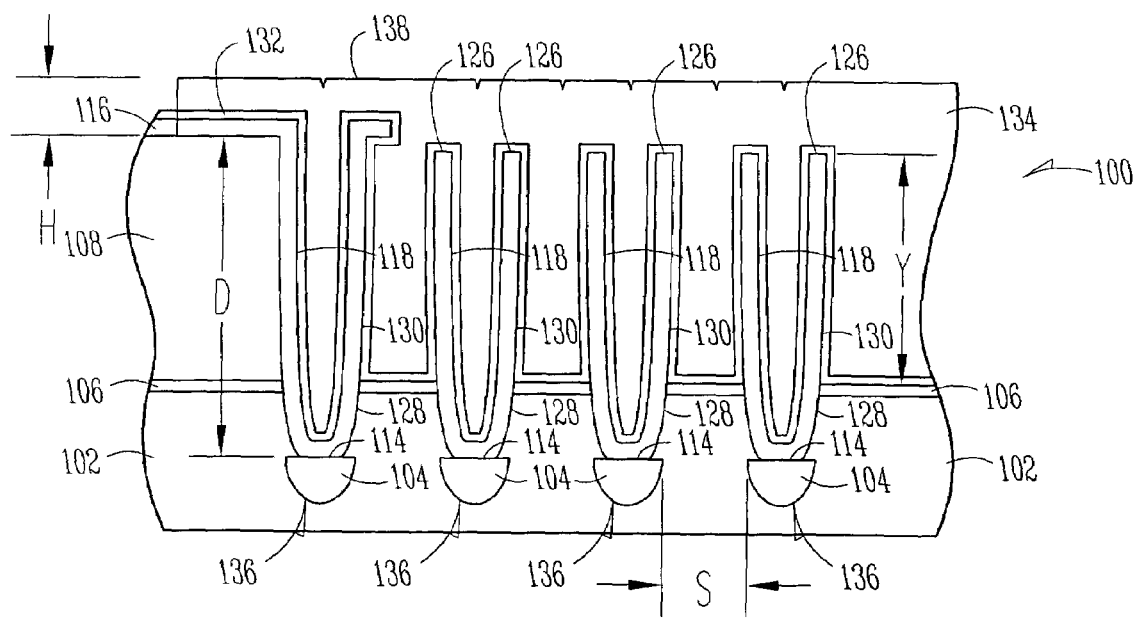

In FIG. 1H, a second plate 134 or second capacitor plate of conductive material can be formed on the dielectric layer 132. The conductive material of the second plate 134 can be a metal, polysilicon or a semiconductor material. The second plate 134 can be formed in bulk over the dielectric layer 132. After forming the second plate 134, the array 100 can be masked off and the peripheral areas of the die can be cleared back to the original level of material. The process of the present invention minimizes the step height H between the surface of the original level of the die and a top surface 138 of the second plate 134, thus creating a more desirable planar process.

The second plate 134 can be a common connection or ground connection for the capacitor array 100. Connection to each of the individual capacitors 136 can be made via the electrodes 104 which can be brought out to a peripheral edge 202 (FIG. 2) of the capacitor array 100 for connection to transistors of a memory cell as discussed hereinbelow or to other components of an integrated circuit.

Figure 3A:
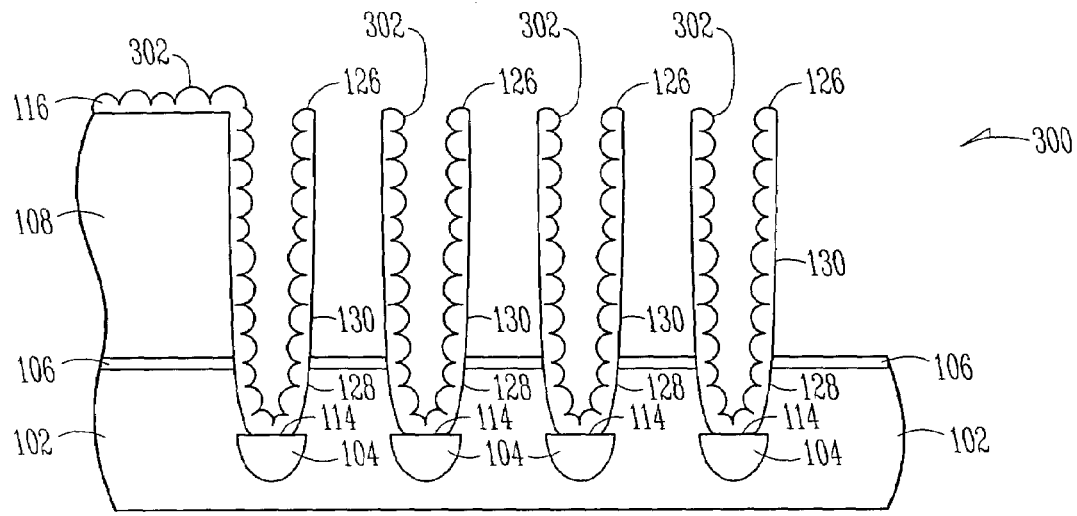
FIGS. 3A–3C illustrate the operations in forming a capacitor or array of capacitors in accordance with an embodiment of the present invention.

Referring to FIG. 3A, in accordance with another embodiment of the present invention, after the process operations described with reference to FIGS. 1A–1F are carried out and the first layer 108 of forming material is removed in FIG. 1F, if the first plates 126 are formed from polysilicon, the interior surfaces 118 of each of the first plates 126 can be converted to hemispherical grains (HSG) 302 by a standard technique. Converting to HSG 302 increases the capacitive area of each of the first plates 126 and thereby increased the capacitance of each of the completed capacitor cells.

Figure 3B:
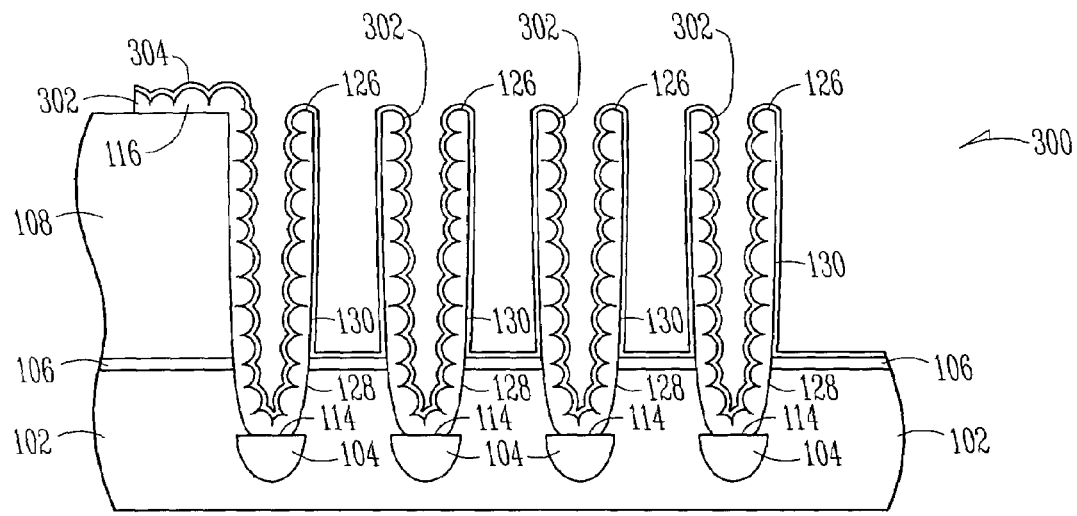
Figure 3C:
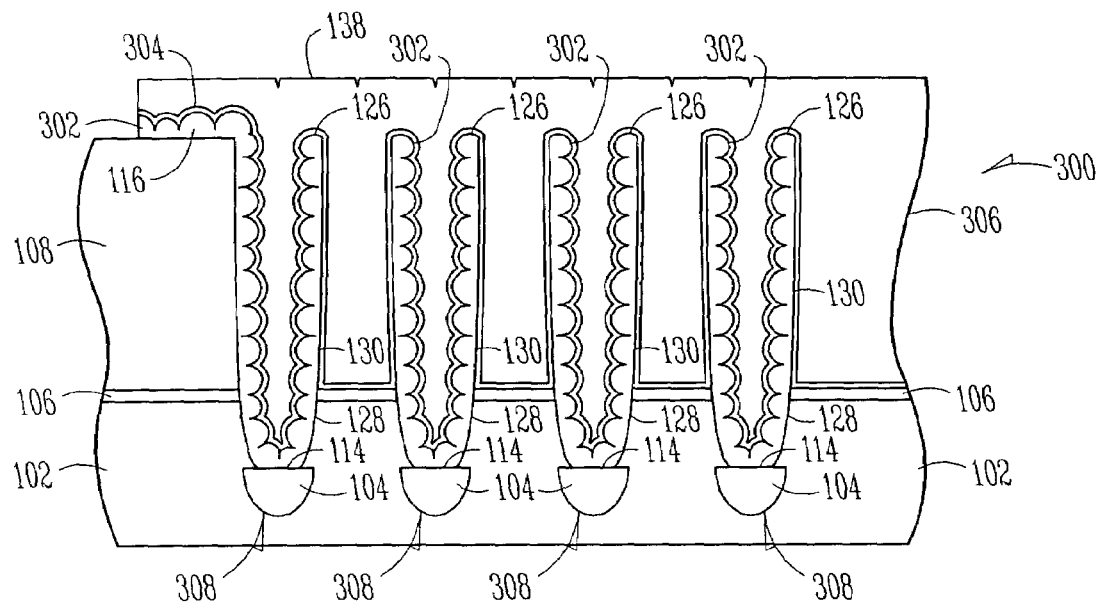

In FIG. 3B, a layer 304 of dielectric material similar to the dielectric layer 132 in FIGS. 1G–1H is formed on the HSG 302 of the first plates 126. The HSG 302 can be etched to remove micro fissures in the HSG 302 to provide a better surface for forming the dielectric layer 304 and so that the dielectric layer 304 can be thinner and thereby provide a higher capacitance. In FIG. 3C, a second conductive plate 306 or second capacitor plate similar to the second capacitor plate 134 in FIG. 1H is formed on the dielectric layer 304.

Figure 4A:
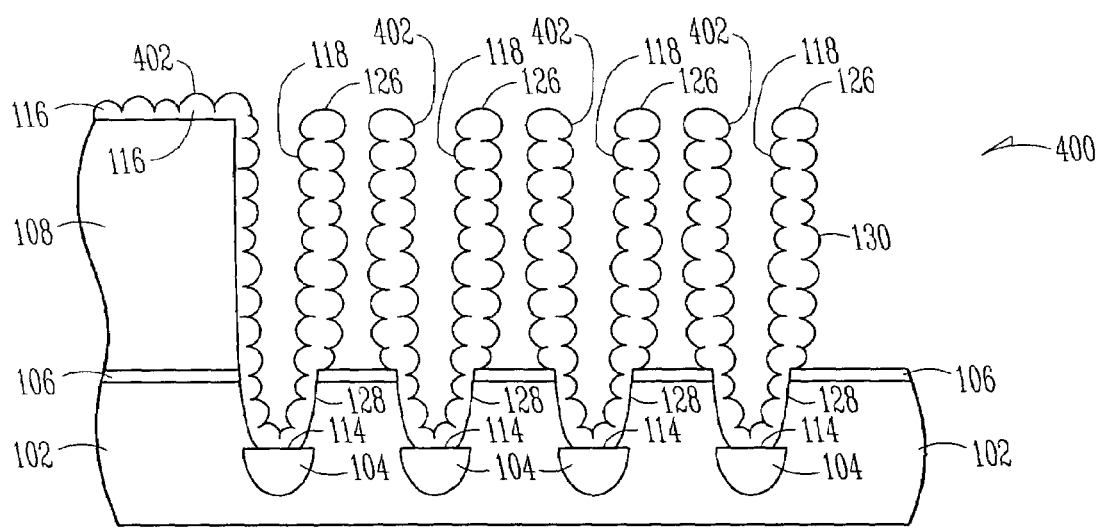
FIGS. 4A–4C illustrate the operations in forming a capacitor or array of capacitors in accordance with another embodiment of the present invention.
Figure 4B:
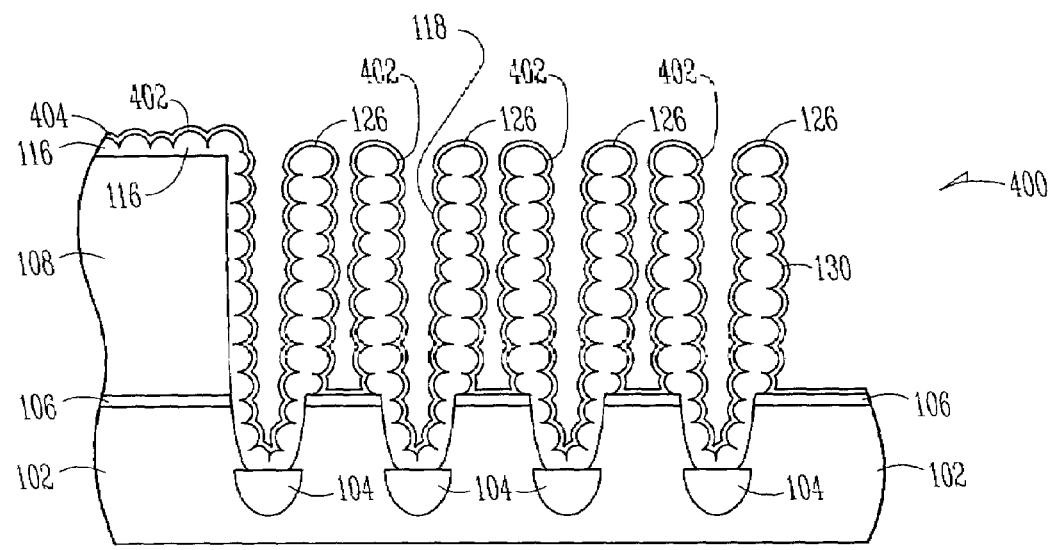
Figure 4C:
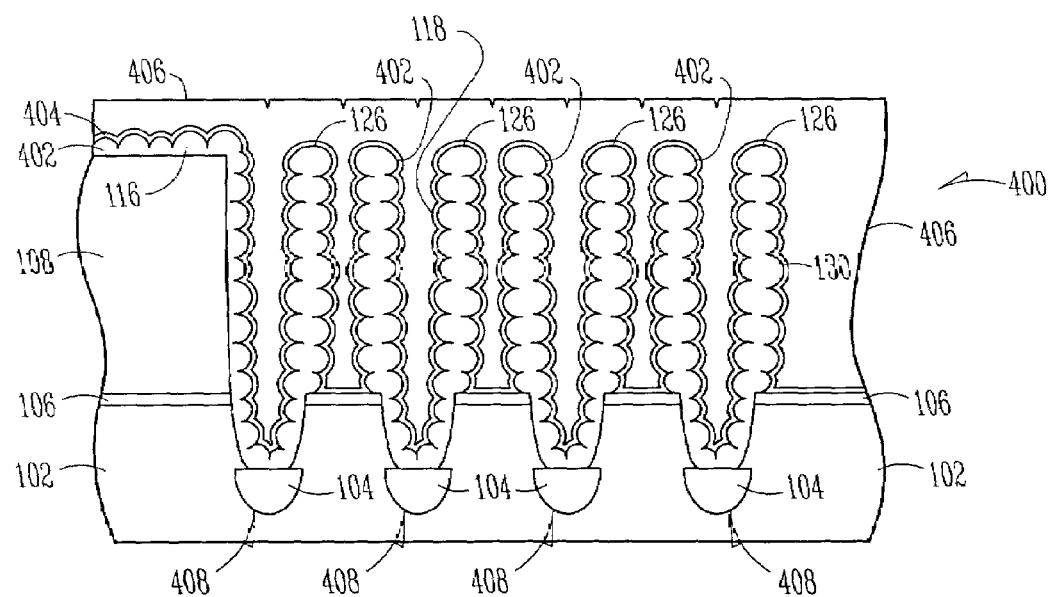

In accordance with another embodiment of the present invention shown in FIG. 4A, the interior surface 118 and exposed exterior surface 130 of each of the first plates 126 (FIG. 1F), if formed from polysilicon, can be converted to HSG 402 using a standard technique. The HSG 402 provide more capacitive surface area to each of the first plates 126 and hence added capacitance to each of the completed capacitor cells. In FIG. 4B, a layer 404 of dielectric material is formed on the HSG 402 of the first plates 126. As previously discussed, the HSG 402 can have micro fissures and can be etched to provide a smoother, more uniform surface on which to deposit the dielectric layer 404. In FIG. 4C, a second conductive plate 406 or second capacitor plate is formed on the dielectric layer 404.

Figure 5:
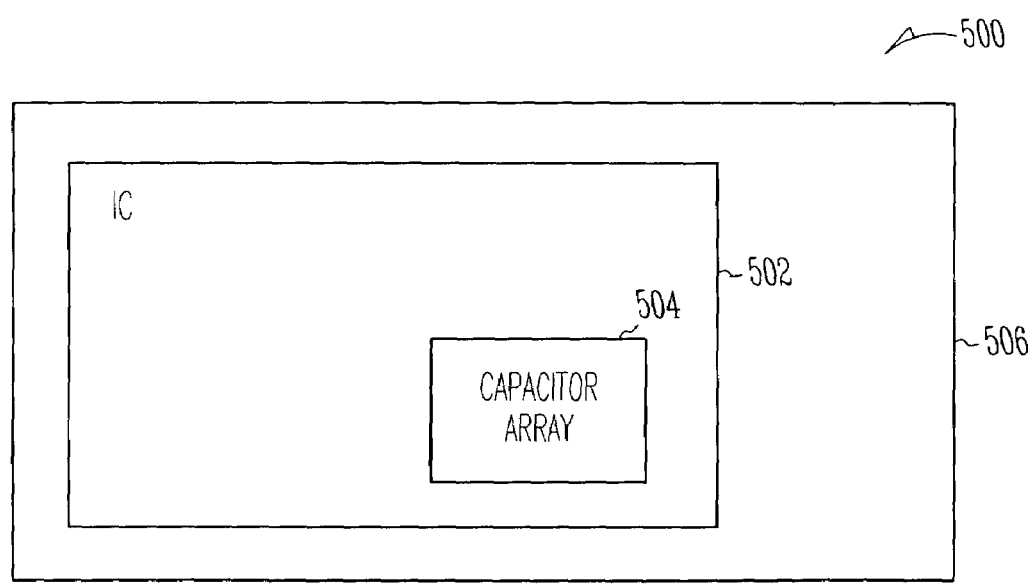
FIG. 5 is a block schematic diagram of a semiconductor die or chip including an integrated circuit and capacitor array in accordance with the present invention.

FIG. 5 is a block schematic diagram of a semiconductor die 500 or chip including an integrated circuit 502 and capacitor array 504 formed on a substrate 506 in accordance with the present invention. The capacitor array 504 can be the same as the capacitor array 100 discussed with respect to FIGS. 1A–1H or the capacitor arrays 300 and 400 in FIGS. 3A–3C and 4A–4C, respectively. Accordingly, the capacitor array 504 of the present invention can be formed on the same semiconductor die 500 or substrate 506 as the integrated circuit 502. As previously discussed, the second conductive plate 134 in FIG. 1H (or second conductive plate 306 in FIG. 3C and second conductive plate 406 in FIG. 4C) can be a common electrode for the capacitor array 100 (or capacitor arrays 300 and 400 in FIGS. 3A–3C and 4A–4C). Each of the individual capacitors 136 in FIG. 1H and individual capacitors 308 and 408 in FIGS. 3C and 4C, respectively can be connected to other components by extending the electrodes 104 (FIGS. 1H, 3C and 4C) to the peripheral edge 202 (FIG. 2) of the capacitor array 100, 300 or 400.

Figure 6:
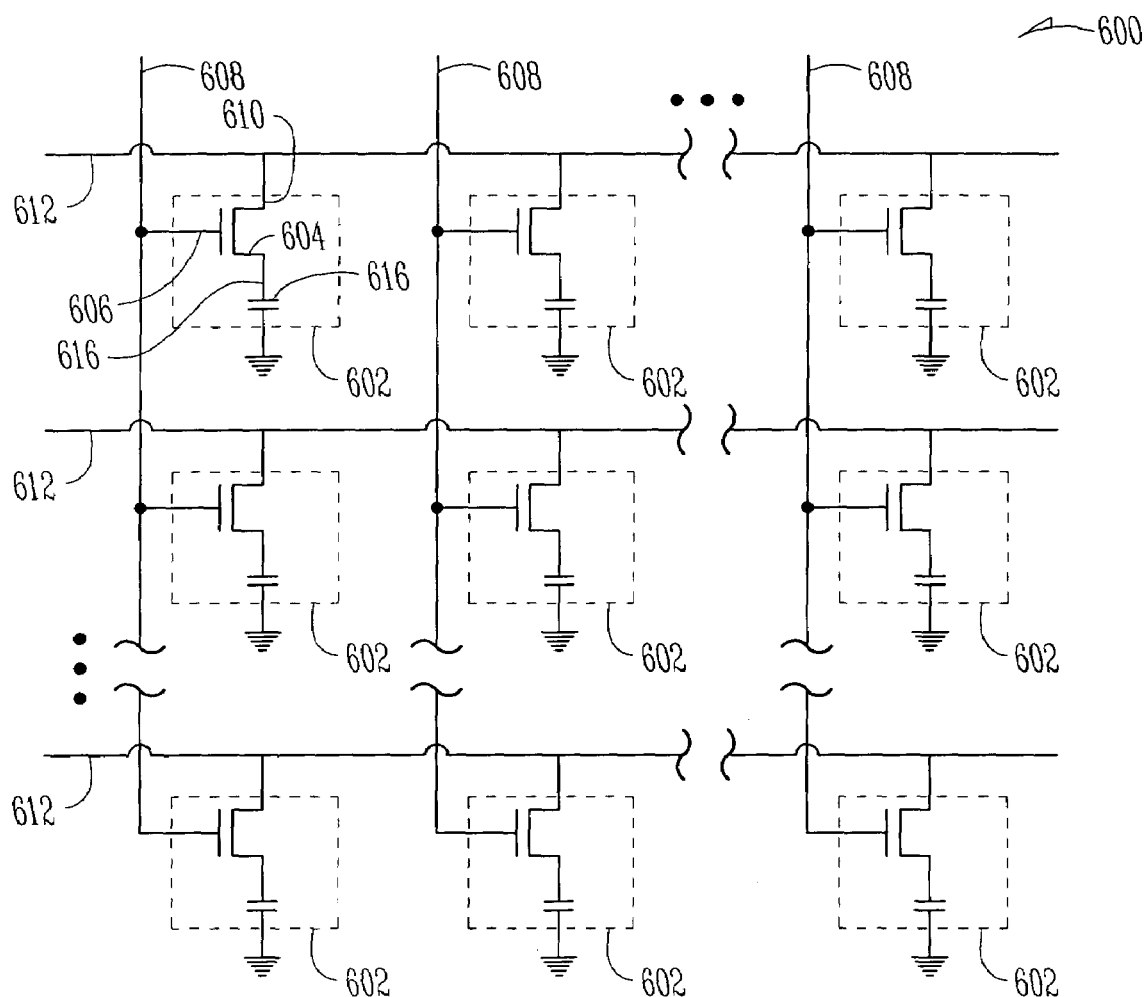
FIG. 6 is a schematic diagram of a memory device or system including capacitors in accordance with the present invention.

FIG. 6 is a schematic diagram of a memory device or system 600 in accordance with the present invention. The memory system 600 is a example of a system where a capacitor array similar to the capacitor array 504 of FIG. 5 can be formed as part of an integrated circuit 502. The memory system 600 includes a plurality of memory elements 602 that can be arranged in rows and columns. Each memory cell 602 can include a transistor 604. Each transistor 604 includes a gate electrode 606 coupled to an address line 608 for controlling the operation of the memory cell 602, and each transistor 604 includes a first source/drain electrode 610 coupled to a data line 612 and a second source/drain electrode 614 coupled to a capacitor 616. The capacitor 616 can be similar to capacitors 126 (FIG. 1H), 308 (FIG. 3C) or 408 (FIG. 4C) and the capacitors 616 for each of the memory cells 602 can be formed in a array similar to arrays 100, 300 and 400.

Figure 7:
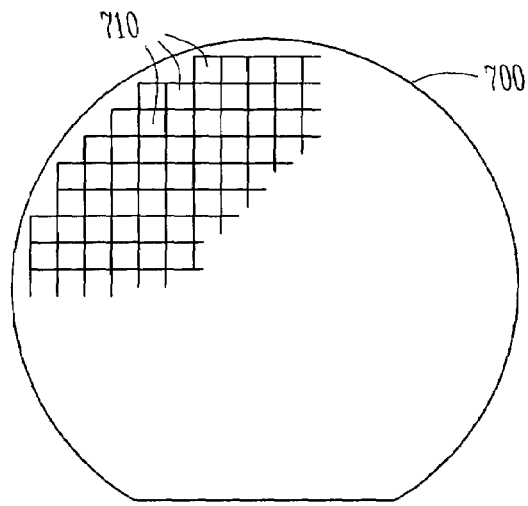
FIG. 7 is a top view of a wafer or substrate containing semiconductor dies in accordance with an embodiment of the present invention.

With reference to FIG. 7, a semiconductor die 710 can be produced from a silicon wafer 700 that can contain an electronic system similar to the electronic system 500 of FIG. 5 and the memory system 600 of FIG. 6 including the novel capacitor 136 or capacitor arrays 100, 300 or 400 in accordance with the present invention. A die 710 is an individual pattern, typically rectangular, on a substrate that contains circuitry to perform a specific function. A semiconductor wafer 700 will typically contain a repeated pattern of such dies 710 containing the same functionality. Die 710 can further contain additional circuitry to extend to such complex devices as a monolithic processor with multiple functionality. Die 710 is typically packaged in a protective casing (not shown) with leads extending therefrom (not shown) providing access to the circuitry of the die 710 for unilateral or bilateral communication and control.

Figure 8:
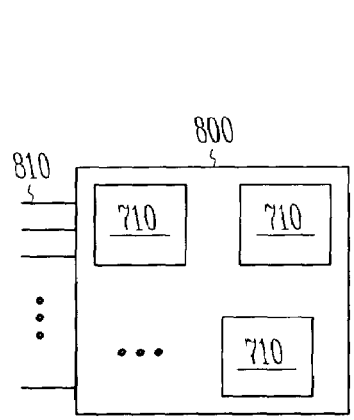
FIG. 8 is a block schematic diagram of a circuit module in accordance with an embodiment of the present invention.

As shown in FIG. 8, two or more dies 710, including at least one electronic system 500 or memory system 600 that incorporates the novel capacitor 136 or capacitor array 100, 300 or 400 in accordance with the present invention, can be combined, with or without a protective casing, into a circuit module 800 to enhance or extend the functionality of an individual die 710. Circuit module 800 can be a combination of dies 710 representing a variety of functions, or a combination of dies 710 containing the same functionality. Some examples of a circuit module 800 include memory modules, device drivers, power modules, communication modems, processor modules and application-specific modules and can include multi-layer, multi-chip modules. Circuit module 800 can be a sub-component of a variety of electronic systems, such as a clock, a television, a cell phone, a personal computer, an automobile, an industrial control system, an aircraft and others. Circuit module 800 will have a variety of leads 810 extending therefrom providing unilateral or bilateral communication and control.

Figure 9:
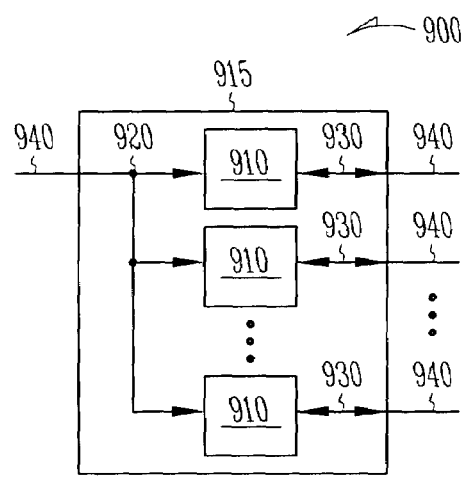
FIG. 9 is a block schematic diagram of a memory module in accordance with an embodiment of the present invention.

FIG. 9 shows one embodiment of a circuit module as a memory module 900 containing circuitry for the memory system 600 including the capacitor array 100, 300 or 400 of the present invention. Memory module 900 generally depicts a Single In-line Memory Module (SIMM) or Dual In-line Memory Module (DIAM). A SIMM or DIAM can generally be a printed circuit board (PCB) or other support containing a series of memory devices. While a SIMM will have a single in-line set of contacts or leads, a DIAM will have a set of leads on each side of the support with each set representing separate I/O signals. Memory module 900 contains multiple memory devices 910 contained on support 915, the number depending upon the desired bus width and the desire for parity. Memory module 900 can contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 9.

Figure 10:
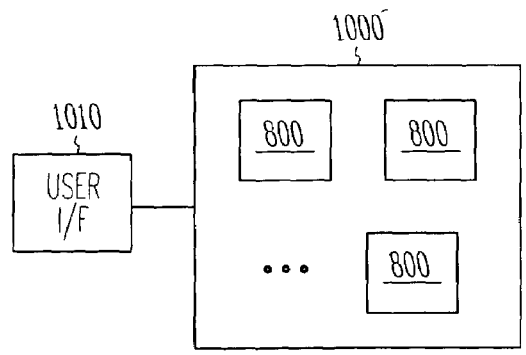
FIG. 10 is a block schematic diagram of an electronic system in accordance with another embodiment the present invention.

FIG. 10 shows an electronic system 1000 containing one or more circuit modules 800 as described above containing the novel memory system 600 and capacitor array 100, 300 or 400 of the present invention. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 can further describe access ports provided to electronic system 1000. Access ports are used to connect an electronic system to the more tangible user interface components previously exemplified. One or more of the circuit modules 800 can be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to the circuit modules 800 and user interface 1010. It will be appreciated that the one or more circuit modules 800 in electronic system 1000 can be replaced by a single integrated circuit. Furthermore, electronic system 1000 can be a sub-component of a larger electronic system.

Figure 11:
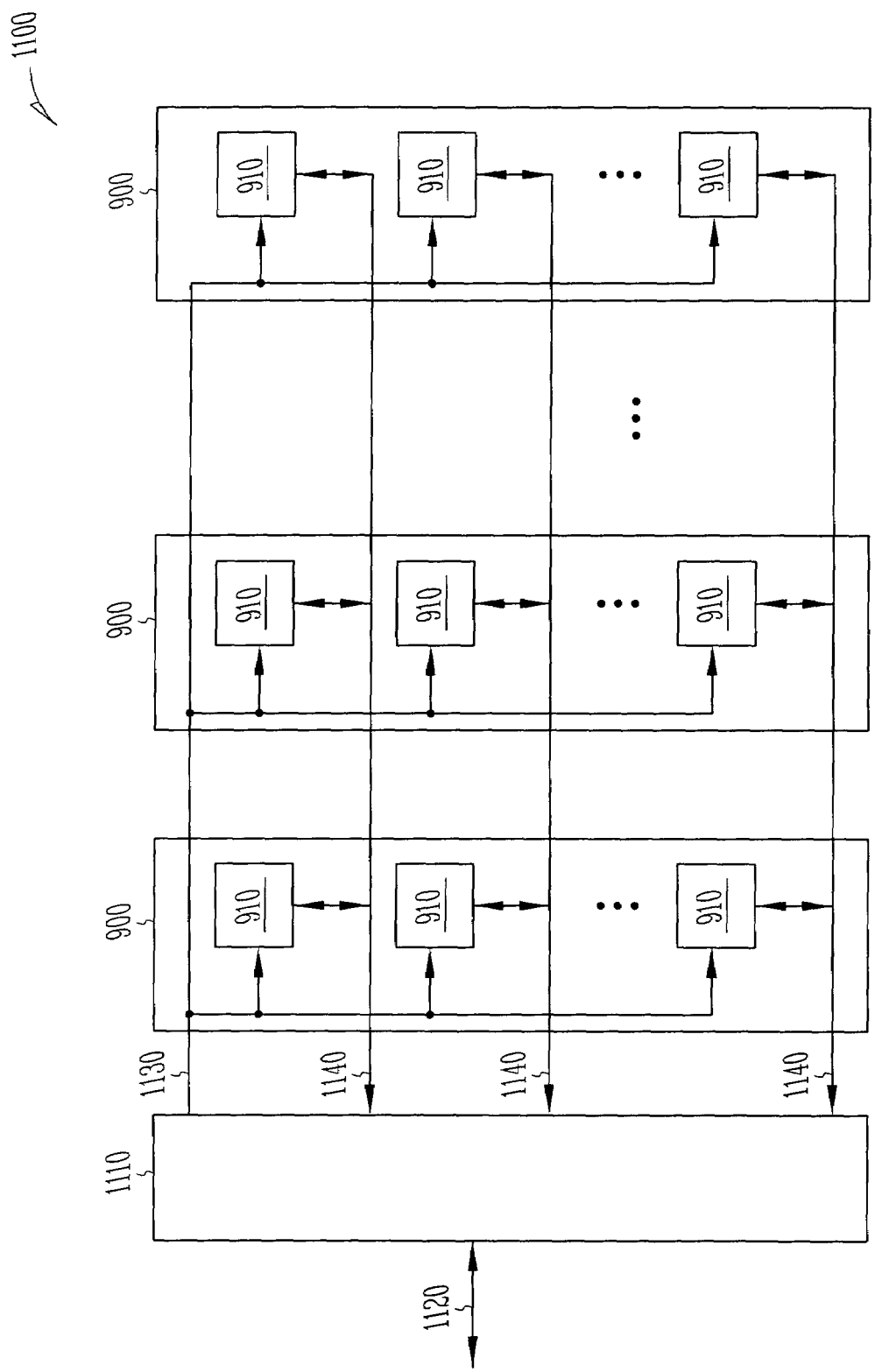
FIG. 11 is a block schematic diagram of a memory system in accordance with an embodiment of the present invention.

FIG. 11 shows one embodiment of an electronic system as memory system 1100. Memory system 1100 contains one or more memory modules 900 as described above including the memory system 600 and capacitor 136 or capacitor array 100, 300 or 400 in accordance with the present invention and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 12:
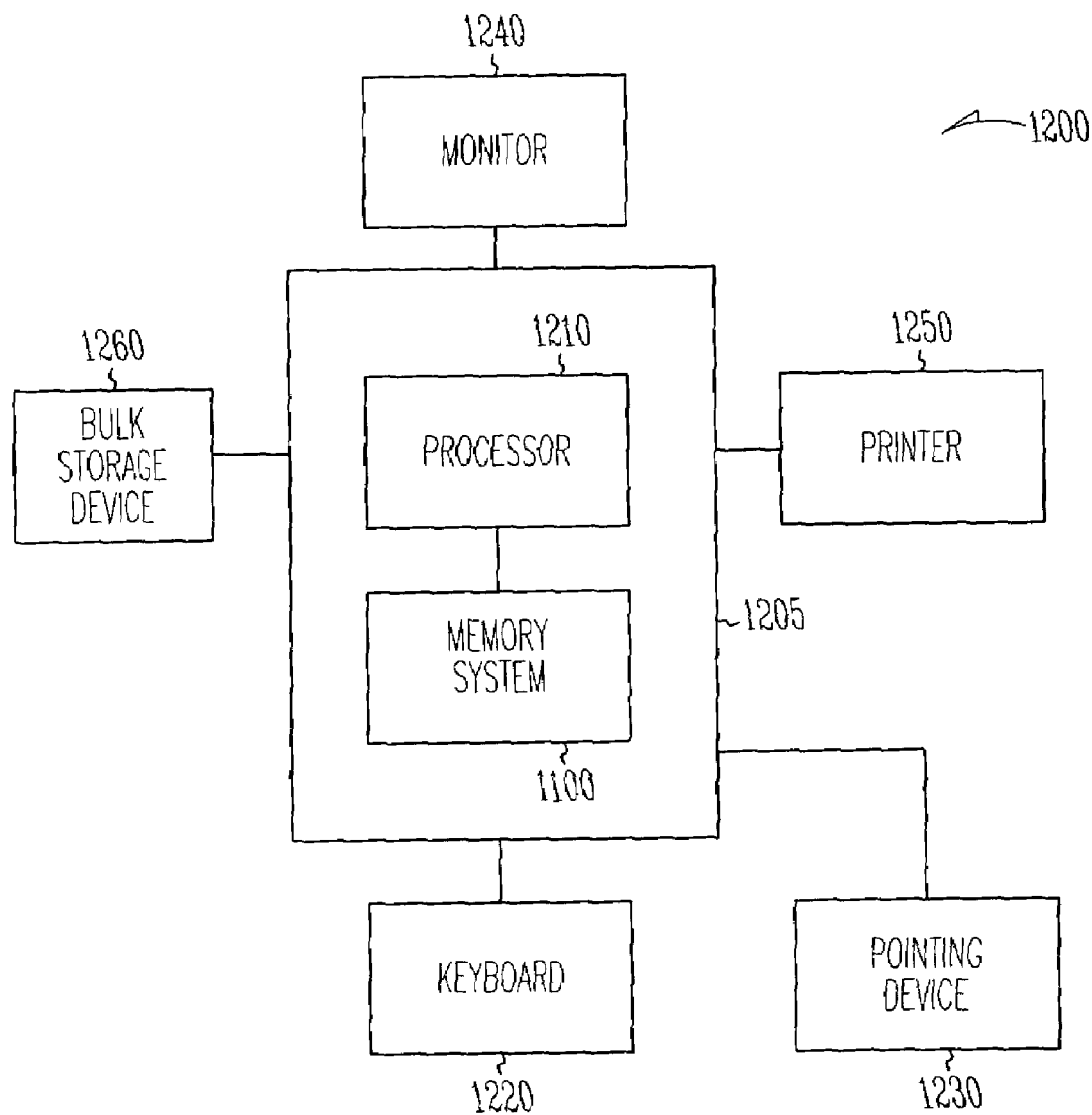
FIG. 12 is a block schematic diagram of a computer system in accordance with an embodiment of the present invention.

FIG. 12 shows a further embodiment of an electronic system as a computer system 1200. Computer system 1200 contains a processor 1210 and a memory system 1100 housed in a computer unit 1215. Computer system 1200 is but one example of an electronic system containing another electronic system, i.e. memory system 1100, as a sub-component. Computer system 1200 optionally contains user interface components. Depicted in FIG. 12 are a keyboard 1220, a pointing device 1230, a monitor 1240, a printer 1250 and a bulk storage device 1260. It will be appreciated that other components are often associated with devices, etc. It will further be appreciated that the processor 1210 and memory system 1100 of computer system 1200 can be incorporated on a single integrated circuit similar to that discussed with respect to FIG. 5. Such single package processing units reduce the communication time between the processor 1210 and the memory system 1100.

CONCLUSION

The present invention thus provides a capacitor or an array of capacitors that maximizes the amount of capacitance and number of capacitors per unit of area of a semiconductor die or chip. The present invention also provides a capacitor or capacitor array that can be manufactured efficiently with minimal process operations. Additionally, the capacitor or capacitor array of the present invention can be manufactured on the same semiconductor die with other components and can be manufactured using process operations that are compatible with the manufacturing processes of other components and that do not interfere with other circuitry or components formed on the same die or chip.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A method of making a capacitor, comprising:
   forming a bottom electrode adapted to act as an etch stop;
   forming a substantially cone-shaped first plate of conductive material having an interior and exterior surface and terminating at the bottom electrode;
   forming a layer of dielectric material on at least a portion of the interior and exterior surface of the first plate and substantially conforming to the shape of the first plate; and
   forming a second plate of conductive material over the layer of dielectric material.

2. A method of making a capacitor, comprising:
   forming a layer of forming material;
   forming at least one cavity with a substantially elliptical cross-section in a surface of the layer of forming material;
   forming a first plate of conductive material on the layer of forming material and in the at least one cavity, wherein the first plate of conductive material forms a shape substantially conforming to the shape of the cavity with a hollow interior surface;
   removing the layer of forming material to a predetermined level to expose at least a portion of an exterior surface of the first plate above a remaining portion of the layer of forming material;
   forming a layer of dielectric material on the first plate substantially conforming to the shape of the first plate; and
   forming a second plate of conductive material over the layer of dielectric material.

3. The method of claim 2, wherein removing the layer of forming material comprises:
   removing a portion of the first plate from a surface of the forming material surrounding the cavity by dry etching the first plate with an etchant that is non-reactive to the forming material.

4. The method of claim 2, wherein removing the layer of forming material comprises wet etching with an etchant that is non-reactive to the first plate of conductive material.

5. The method of claim 2, wherein forming the layer of dielectric material comprises forming a layer of one of a nitride or an oxide.

6. A method of making a capacitor, comprising:
   forming a first layer of forming material;
   forming a nucleation layer on the first layer of forming material;
   forming a second layer of forming material on the nucleation layer;
   forming at least one cavity having a substantially elliptical cross-section in the first layer of forming material, the nucleation layer and the second layer of forming material;
   forming a first plate of conductive material on the second layer of forming material and in the at least one cavity, wherein the first layer of conductive material forms a shape substantially conforming to the shape of the cavity with a hollow interior surface;
   removing the first plate of conductive material from the surface of the second layer of forming material around the cavity;

removing the second layer of forming material to expose the nucleation layer and to expose at least a portion of an exterior surface of the first plate of conductive material extending above of the nucleation layer;

forming a layer of dielectric material on the first plate that substantially conforms to the shape of the first plate; and forming a second plate of conductive material over the layer of dielectric material.

7. The method of claim 6, wherein forming the second layer of forming material comprises forming a layer of doped oxide.

8. The method of claim 6, wherein forming the nucleation layer comprises forming a layer of undoped oxide.

9. A method of making a capacitor, comprising:

forming a first layer of forming material;

forming a nucleation layer on the first layer of forming material;

forming a second layer of forming material on the nucleation layer;

forming at least one cavity having a substantially elliptical cross-section in the first layer of forming material, the nucleation layer and the second layer of forming material;

forming a first plate of conductive material on the second layer of forming material and in the at least one cavity, wherein the first layer of conductive material forms a shape substantially conforming to the shape of the cavity with a hollow interior surface;

removing the first plate of conductive material from the surface of the second layer of forming material around the cavity;

removing the second layer of forming material to expose the nucleation layer and to expose at least a portion of an exterior surface of the first plate of conductive material extending above of the nucleation layer;

converting at least one of an interior surface and an exterior surface of the first plate exposed above the nucleation layer to hemispherical grains;

forming a layer of dielectric material on the first plate substantially conforming to the shape of the first plate and the hemispherical grains; and forming a second plate of conductive material over the layer of dielectric material.

10. A method of making an array of capacitors, comprising:

forming a plurality of first plates of conductive material on a layer of forming material and in a plurality of substantially cone-shaped cavities, wherein the first plates of conductive material have a substantially hollow cone-shape conforming to the shape of the cavities;

removing the first plates of conductive material from the surface of the layer of forming material around the cavities;

removing the layer of forming material to a predetermined level to expose at least a portion of an exterior surface of the first plates;

forming a layer of dielectric material on the plurality of first plates and substantially conforming to the shape of each of the first plates; and forming a plurality of second plates of conductive material over the layer of dielectric material.

11. A method of making an array of capacitors, comprising:

forming a layer of forming material;

forming a plurality of cavities in a surface of the layer of forming material, each cavity having a substantially elliptical cross-section;

forming a plurality of first plates of conductive material on the layer of forming material and in each of the cavities, wherein each first plate is formed in a shape conforming to the shape of the cavity;

removing the layer of forming material to a predetermined level to expose at least a portion of an exterior surface of each of the first plates above a remaining portion of the layer of forming material;

forming a layer of dielectric material on the first plates substantially conforming to the shape of the first plate; and forming a second plate of conductive material over the layer of dielectric material.

12. A method of making an array of capacitors, comprising:

forming a first layer of forming material;

forming a nucleation layer on the first layer of forming material;

forming a second layer of forming material on the nucleation layer;

forming a plurality of cavities having substantially elliptical cross-sections in the first layer of forming material, the nucleation layer and the second layer of forming material;

forming a first plate layer of conductive material on the second layer of forming material and in each of the plurality of cavities, wherein the first plate layer of conductive material forms a shape conforming to the shape of each of the cavities with a hollow interior surface;

selectively removing portions of the first plate layer of conductive material from the surface of the second layer of forming material from around each of the cavities to form a plurality of first capacitor plates;

removing the second layer of forming material using the first capacitor plates as a mask to expose the nucleation layer and to expose at least a portion of an exterior surface of each first capacitor plate extending above the nucleation layer;

forming a layer of dielectric material on the nucleation layer and on each of the first capacitor plates that substantially conforms to the shape of each of the first capacitor plates; and forming a second capacitor plate of conductive material over the layer of dielectric material.

13. A method of making a memory system, comprising:

forming an array of memory elements; and forming a capacitor associated with each memory element, wherein forming each capacitor includes:

forming a first plate of conductive material on a layer of forming material and in a substantially cone-shaped cavity, wherein the first plate of conductive material has a substantially hollow cone-shape conforming to the shape of the cavity;

removing the first plate of conductive material from the surface of the layer of forming material around the cavity;

removing the layer of forming material to a predetermined level to expose at least a portion of an exterior surface of the first plate;

forming a layer of dielectric material formed on at least a portion of the first plate and substantially conforming to the shape of the first plate, and forming a second plate of conductive material formed over the layer of dielectric material.

14. A method of making a memory system, comprising:
forming an array of memory elements; and
forming a capacitor associated with each memory element, wherein forming each capacitor includes:
  forming a first layer of forming material,
  forming a nucleation layer on the first layer of forming material,
  forming a second layer of forming material on the nucleation layer,
  forming at least one cavity having a substantially elliptical cross-section in the first layer of forming material, the nucleation layer and the second layer of forming material,
  forming a first plate of conductive material on the second layer of forming material and in the at least one cavity, wherein the first layer of conductive material forms a shape conforming to the shape of the cavity with a hollow interior portion,
  removing the first plate of conductive material from the surface of the second layer of forming material around the cavity,
  removing the second layer of forming material to expose the nucleation layer and to expose at least a portion of an exterior surface of the first plate of conductive material extending above of the nucleation layer,
  forming a layer of dielectric material on the first plate that substantially conforms to the shape of the first plate, and
  forming a second plate of conductive material over the layer of dielectric material.

15. A method of making a semiconductor die, comprising:
providing a substrate;
forming an integrated circuit supported by the substrate; and
forming a capacitor associated with the integrated circuit, wherein forming the capacitor includes:
  forming a first plate of conductive material on a layer of forming material and in a substantially cone-shaped cavity, wherein the first plate of conductive material has a substantially hollow cone-shape conforming to the shape of the cavity;
  removing the first plate of conductive material from the surface of the layer of forming material around the cavity;
  removing the layer of forming material to a predetermined level to expose at least a portion of an exterior surface of the first plate;
  forming a layer of dielectric material formed on at least a portion of the first plate and substantially conforming to the shape of the first plate, and
  forming a second plate of conductive material formed over the layer of dielectric material.

16. A method of making a semiconductor die, comprising:
providing a substrate;
forming an integrated circuit supported by the substrate; and
forming a capacitor associated with the integrated circuit, wherein forming the capacitor includes:
  forming a first layer of forming material;
  forming a nucleation layer on the first layer of forming material;
  forming a second layer of forming material on the nucleation layer;
  forming at least one cavity having a substantially elliptical cross-section in the first layer of forming material, the nucleation layer and the second layer of forming material;
  forming a first plate of conductive material on the second layer of forming material and in the at least one cavity, wherein the first layer of conductive material forms a shape conforming to the shape of the cavity with a hollow interior surface;
  removing the first plate of conductive material from the surface of the second layer of forming material around the cavity;
  removing the second layer of forming material to expose the nucleation layer and to expose at least a portion of an exterior surface of the first plate of conductive material extending above of the nucleation layer;
  forming a layer of dielectric material on the first plate that substantially conforms to the shape of the first plate; and
  forming a second plate of conductive material over the layer of dielectric material.

17. A method of making an electronic system, comprising:
forming a processor; and
forming a memory system coupled to the processor and including a plurality of memory cells, wherein forming the memory system includes forming a capacitor associated with each memory cell of the memory system and wherein forming each capacitor includes:
  forming a first plate of conductive material on a layer of forming material and in a substantially cone-shaped cavity, wherein the first plate of conductive material has a substantially hollow cone-shape conforming to the shape of the cavity;
  removing the first plate of conductive material from the surface of the layer of forming material around the cavity;
  removing the layer of forming material to a predetermined level to expose at least a portion of an exterior surface of the first plate;
  forming a layer of dielectric material formed on at least a portion of the first plate and substantially conforming to the shape of the first plate, and
  forming a second plate of conductive material formed over the layer of dielectric material.

18. A method of making an electronic system, comprising:
forming a processor; and
forming a memory system coupled to the processor and including a plurality of memory cells, wherein forming the memory system includes forming a capacitor associated with each memory cell of the memory system and wherein forming each capacitor includes:
  forming a first layer of forming material;
  forming a nucleation layer on the first layer of forming material;
  forming a second layer of forming material on the nucleation layer;
  forming at least one cavity having a substantially elliptical cross-section in the first layer of forming material, the nucleation layer and the second layer of forming material;
  forming a first plate of conductive material on the second layer of forming material and in the at least one cavity, wherein the first layer of conductive material forms a shape conforming to the shape of the cavity with a hollow interior surface;

removing the first plate of conductive material from the surface of the second layer of forming material around the cavity;

removing the second layer of forming material to expose the nucleation layer and to expose at least a portion of an exterior surface of the first plate of conductive material extending above of the nucleation layer;

forming a layer of dielectric material on the first plate that substantially conforms to the shape of the first plate; and forming a second plate of conductive material over the layer of dielectric material.

19. A capacitor, comprising:
a first plate of conductive material formed in a substantially cone-shape with an open interior portion, wherein at least one of an interior surface and at least a portion of an exterior surface of the first plate are converted into hemispherical grains;
a layer of dielectric material formed on at least a portion of the first plate and substantially conforming to the shape of the first plate; and
a second plate of conductive material formed over the layer of dielectric material.

20. A capacitor, comprising:
a layer of forming material;
a first plate of conductive material formed in a substantially cone-shape including an open interior portion and a closed end extending partially into the layer of forming material;
a layer of dielectric material formed on an interior surface and an exposed exterior surface of the first plate extending outside of the layer of forming material, wherein the layer of dielectric material substantially conforms to the shape of the first plate; and
a second plate of conductive material formed over the layer of dielectric material.

21. An array of capacitors, comprising:
a plurality of first plates of conductive material, each formed in a substantially cone-shape with an open interior portion;
a layer of dielectric material formed on the plurality of first plates and substantially conforming to the shape of each of the first plates; and
a second plate of conductive material formed over the layer of dielectric material.

22. A memory system, comprising:
at least one memory element including a capacitor, the capacitor including:
a first plate of conductive material formed in a substantially cone-shape,
a layer of dielectric material formed on at least a portion of the first plate and substantially conforming to the shape of the first plate, and
a second plate of conductive material formed over the layer of dielectric material.

23. The memory system of claim 22, wherein the first plate comprises at least one of a metal and a semiconductor material.

24. The memory system of claim 22, wherein the layer of dielectric material comprises one of a nitride layer and an oxide layer.

25. The memory system of claim 22, wherein the substantially cone-shaped first plate has a substantially elliptical cross-section.

26. A semiconductor die, comprising:
a substrate; and
an integrated circuit formed supported by the substrate, wherein the integrated circuit comprises at least one capacitor, the at least one capacitor including:
a first plate of conductive material formed in a substantially cone-shape,
a layer of dielectric material formed on at least a portion of the first plate and substantially conforming to the shape of the first plate, and
a second plate of conductive material formed over the layer of dielectric material.

27. An electronic system, comprising:
a processor; and
a memory system coupled to the processor, the memory system comprising an array of memory elements and each memory element including a capacitor, each capacitor including:
a first plate of conductive material formed in a substantially cone-shape,
a layer of dielectric material formed on at least a portion of the first plate and substantially conforming to the shape of the first plate, and
a second plate of conductive material formed over the layer of dielectric material.

* * * * *

UNITED STATES PATENT AND TRADEMARK OFFICE
CERTIFICATE OF CORRECTION

PATENT NO. : 7,115,970 B2 Page 1 of 1
APPLICATION NO. : 10/931718
DATED : October 3, 2006
INVENTOR(S) : Gilgen et al.

It is certified that error appears in the above-identified patent and that said Letters Patent is hereby corrected as shown below:

On Title page

On page 2, in item (56), under "U.S. Patent Documents", in column 2, line 6, after "6,329, 683 delete "B1" and insert -- B2 --, therefor.

On page 2, in item (56), under "U.S Patent Documents", in column 2, line 20, after "6,483,194" delete "B1" and insert -- B2 --, therefor.

On page 2, in item (56), under "U.S. Patent Documents", in column 2, line 21, after "6,537,874" delete "B1" and insert -- B2 --, therefor.

On page 2, in item (56), under "U.S. Patent Documents", in column 2, line 23, after "6,838,719" delete "B1" and insert -- B2 --, therefor.

Column 7, line 53, after "is" delete "a" and insert -- an --, therefor.

Column 7, line 66, after "in" delete "a" and insert -- an --, therefor.

Column 9, line 44, after "with" insert -- computer system 1200 such as modems, device driver cards, additional storage --.

Signed and Sealed this

Thirteenth Day of March, 2007

JON W. DUDAS
*Director of the United States Patent and Trademark Office*